(12) United States Patent
Bi (10) Patent No.: US 11,749,335 B2
(45) Date of Patent: Sep. 5, 2023

(54) HOST AND ITS MEMORY MODULE AND MEMORY CONTROLLER

(71) Applicants: Jianzhong Bi, Shandong (CN); Shandong Storage Wings Electronics Technology Co., LTD, Shandong (CN)

(72) Inventor: Jianzhong Bi, Hsinchu County (TW)

(73) Assignees: Jianzhong Bi, Shandong (CN); SHANDONG STORAGE WINGS ELECTRONICS TECHNOLOGY CO., LTD, Shandong (CN)

( * ) Notice: Subject to any disclaimer, the term of this patent is extended or adjusted under 35 U.S.C. 154(b) by 256 days.

(21) Appl. No.: 17/087,638

(22) Filed: Nov. 3, 2020

(65) Prior Publication Data

US 2022/0139438 A1    May 5, 2022

(51) Int. Cl.
*G06F 3/06* (2006.01)
*G06F 12/12* (2016.01)
*G11C 11/4072* (2006.01)
*G11C 11/4074* (2006.01)
*G11C 5/06* (2006.01)
(Continued)

(52) U.S. Cl.
CPC ...... *G11C 11/4072* (2013.01); *G06F 9/30043* (2013.01); *G06F 9/4498* (2018.02); *G06F 13/409* (2013.01); *G06F 13/4068* (2013.01); *G06F 13/4221* (2013.01); *G11C 5/06* (2013.01); *G11C 11/4074* (2013.01); *G06F 2213/0026* (2013.01)

(58) Field of Classification Search
None
See application file for complete search history.

(56) References Cited

U.S. PATENT DOCUMENTS 5,590,340 A * 12/1996 Morita .................. G06F 9/4418
                                                    713/323
10,901,886 B2 * 1/2021 Bi ........................... G06F 3/064
(Continued)

FOREIGN PATENT DOCUMENTS

CN    102736861    10/2012
TW    200834585    8/2008
(Continued)

OTHER PUBLICATIONS

"Office Action of Taiwan Counterpart Application", dated Mar. 8, 2022, p. 1-p. 3.

*Primary Examiner* — Hyun Nam
(74) *Attorney, Agent, or Firm* — JCIPRNET (57) ABSTRACT

A memory module without a controller and without a built-in power supply and a memory controller thereof are provided. The memory module includes a connection portion, a first non-volatile memory chip, and a second non-volatile memory chip. The memory controller of the motherboard accesses the first non-volatile memory chip by a native interface of the first non-volatile memory chip through the connection portion. The second non-volatile memory chip is configured to store at least one pointer of a meta data of the first non-volatile memory chip. The memory type of the second non-volatile memory chip is different from the memory type of the first non-volatile memory chip. The memory controller accesses the pointer stored in the second non-volatile memory chip through the connection portion.

20 Claims, 5 Drawing Sheets

(51) Int. Cl.
    *G06F 9/448* (2018.01)
    *G06F 13/42* (2006.01)
    *G06F 13/40* (2006.01)
    *G06F 9/30* (2018.01)

(56) References Cited

U.S. PATENT DOCUMENTS

| | | | |
|---|---|---|---|
| 11,003,527 B2* | 5/2021 | Bi | G06F 11/1068 |
| 2002/0062429 A1* | 5/2002 | Tsuboki | G06F 11/2066 |
| | | | 711/157 |
| 2007/0028282 A1* | 2/2007 | Kooijmans | H04N 21/4113 |
| | | | 725/132 |
| 2007/0128899 A1* | 6/2007 | Mayer | G06F 9/4406 |
| | | | 439/152 |
| 2007/0216688 A1* | 9/2007 | Sawazaki | G06T 11/203 |
| | | | 345/467 |
| 2009/0077284 A1* | 3/2009 | Iyer | G06F 3/0607 |
| | | | 711/E12.001 |
| 2009/0150605 A1* | 6/2009 | Flynn | G06F 12/1027 |
| | | | 711/E12.001 |
| 2011/0010514 A1* | 1/2011 | Benhase | G06F 3/061 |
| | | | 711/170 |
| 2015/0301754 A1* | 10/2015 | Kochar | G06F 3/0679 |
| | | | 711/103 |
| 2018/0181510 A1* | 6/2018 | Liu | G06F 13/36 |
| 2020/0169383 A1* | 5/2020 | Durham | H04L 9/14 |
| 2020/0356396 A1* | 11/2020 | Bert | G06F 9/45558 |
| 2020/0401404 A1* | 12/2020 | Robillard | G06F 3/067 |
| 2022/0139438 A1* | 5/2022 | Bi | G11C 11/4072 |
| | | | 365/226 |
| 2022/0284942 A1* | 9/2022 | Srinivasa | G11C 5/14 |
| 2023/0075329 A1* | 3/2023 | Surianarayanan | G06F 3/0679 |

FOREIGN PATENT DOCUMENTS

| | | |
|---|---|---|
| TW | 201142605 | 12/2011 |
| TW | 201407468 | 2/2014 |
| TW | I674502 | 10/2019 |

* cited by examiner

HOST AND ITS MEMORY MODULE AND MEMORY CONTROLLER

BACKGROUND

Technical Field

The disclosure relates to a host disposed with a random access memory module; particularly, the disclosure relates to a memory module and a memory controller.

Description of Related Art

Currently, non-volatile random access memory modules manage the operation of a plurality of non-volatile memory chips through controllers on the non-volatile random access memory modules. With the trend of increasing memory capacity, a heat dissipation problem is caused by the controllers on the non-volatile random access memory modules during management of a great number of memory chips. In addition, the existing non-volatile random access memory modules are connected to a motherboard of a host based on a double data rate (DDR) interface, such as OPTANE DIMM interface of INTEL or NVDIMM interface of SNIA. However, since the native interface of the non-volatile memory chips is not the DDR interface, the controllers on the non-volatile random access memory modules need to perform interface conversion, so that output data of the non-volatile memory chip is transmitted to the motherboard through the DDR interface, and output data of the motherboard is transmitted to the non-volatile memory chips through the DDR interface.

SUMMARY

The disclosure provides a memory module, a memory controller, and a host to provide non-volatile random access.

In the disclosure, the memory module without a controller and without a built-in power supply is adapted to be inserted in a connector of a motherboard. The memory module includes a connection portion, at least one first non-volatile memory chip, and a second non-volatile memory chip. The connection portion is configured to be coupled to the connector of the motherboard. The at least one first non-volatile memory chip is coupled to the connection portion. A memory controller of the motherboard accesses the first non-volatile memory chip by a native interface of the first non-volatile memory chip through the connector. The second non-volatile memory chip is coupled to the connection portion, and is configured to store at least one pointer of a meta data related to the first non-volatile memory chip. A memory type of the second non-volatile memory chip is different from a memory type of the first non-volatile memory chip. The memory controller accesses the pointer stored in the second non-volatile memory chip through the connector.

The memory controller of the disclosure is adapted to be provided on a motherboard. The memory controller includes a finite state machine (FSM) circuit, a routing circuit, and a plurality of non-volatile memory controllers. The finite state machine circuit includes a plurality of finite state machine sets. The routing circuit is coupled to the finite state machine circuit. The plurality of non-volatile memory controllers are coupled to the routing circuit. Each of the non-volatile memory controllers is adapted to be coupled to a corresponding data channel of each of a plurality of connectors of the motherboard to access a first non-volatile memory chip of a memory module through one of the plurality of connectors. Each of the plurality of finite state machine sets corresponds to one of the connectors.

The host of the disclosure includes at least one memory module and a motherboard. The motherboard includes a memory controller and a plurality of connectors. The memory module includes a connection portion, at least one first non-volatile memory chip, and a second non-volatile memory chip. The connection portion is adapted to be coupled to any one of the connectors of the motherboard. A memory type of the second non-volatile memory chip is different from a memory type of the first non-volatile memory chip. The memory controller accesses the first non-volatile memory chip by a native interface of the first non-volatile memory chip through one of the connectors. The second non-volatile memory chip is configured to store at least one pointer of a meta data related to the first non-volatile memory chip. The memory controller accesses the pointer stored in the second non-volatile memory chip through one of the connectors.

Based on the foregoing, the memory module described in the embodiments of the disclosure is not provided with a memory controller or a built-in power supply circuit. Therefore, the memory module provides additional space to accommodate more memory chips, thereby increasing the memory capacity of the memory module and solving the problem of heat dissipation.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The term "coupling (or connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

A rewritable non-volatile memory module includes a controller, a plurality of non-volatile memory chips (e.g., flash memory), a plurality of volatile memory chips (e.g., dynamic random access memory), and a built-in power supply. A host writes data to the memory module or reads data from the memory module. Specifically, the host accesses the memory chip through the controller of the memory module. Since the volatile memory chip requires a power supply for data to be stored, the memory module requires to be provided with a built-in power supply, so that in the event of a sudden power failure, the volatile memory chip stores data thereof in the non-volatile memory chip using the built-in power supply.

However, with increasing capacity of the memory module, a heat dissipation problem is caused by the controller that manages a great number of memory chips. In the event that the host has a plurality of memory modules, the heat dissipation problem caused by the controller exacerbates since each memory module has its own controller. In addition, the pin design of the memory module often adopts the DDR interface instead of the native interface of the memory chip. Therefore, the native interface of the memory chip is required to be converted into the DDR interface for the host to access data.

Based on the foregoing, in the following embodiments, the controller is provided on the motherboard, so one same one controller manages a plurality of memory modules at the same time, which solves the problem of heat dissipation. Furthermore, the memory modules in the following embodiments may not include a volatile memory chip, so the built-in power supply may be omitted. Furthermore, the interface between the memory module and the motherboard adopts the native interface of the non-volatile memory chip, so the memory module does not require to convert the native interface into a DDR interface. That is to say, for the memory module in the following embodiments may not be provided with the controller, the volatile memory chip, and the active power supply to save space. The space thus saved may accommodate more non-volatile memory chips, increasing the capacity of the memory module.

Figure 1:
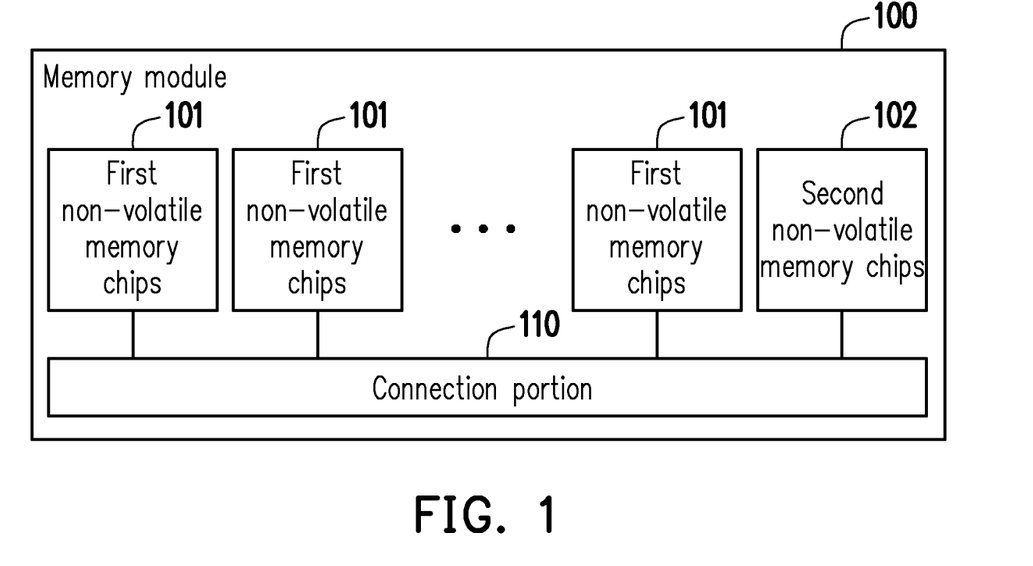
FIG. 1 is a schematic circuit block diagram of a memory module according to an embodiment of the disclosure.

FIG. 1 is a schematic circuit block diagram of a memory module according to an embodiment of the disclosure. With reference to FIG. 1, a memory module 100 without a controller and without a built-in power supply includes at least one first non-volatile memory chip 101, one second non-volatile memory chip 102, and a connection portion 110. The first non-volatile memory chip 101 and the second non-volatile memory chip 102 are respectively coupled to the connection portion 110. The second non-volatile memory chip 102 may be configured to store at least one pointer of a meta data related to the first non-volatile memory chip 101. Depending on design requirements, in some embodiments, the meta data may include at least one of address mapping information, bad block information, timing information, and namespace information of the first non-volatile memory chip, but the disclosure is not limited thereto.

In addition, a memory type of the second non-volatile memory chip 102 may be different from a memory type of the first non-volatile memory chip 101. Depending on design requirements, in one embodiment, the first non-volatile memory chip 101 may be a NAND flash memory chip or other flash memory, the second non-volatile memory chip 102 may be an electrically-erasable programmable read-only memory (EEPROM) or other rewritable memory. The second non-volatile memory chip 102 may be coupled to the motherboard via the connection portion 110 adopting an inter-integrated circuit ($I^2C$) interface or any other data transmission interface. However, the type of the first non-volatile memory chip 101 and the type of the second non-volatile memory chip 102 in this embodiment are not limited thereto.

Figure 2:
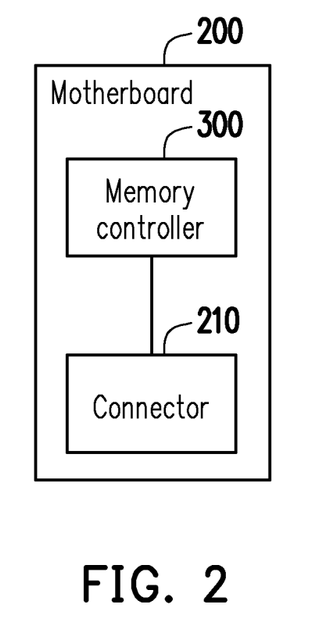
FIG. 2 is a schematic circuit block diagram of a motherboard according to an embodiment of the disclosure.
Figure 3:
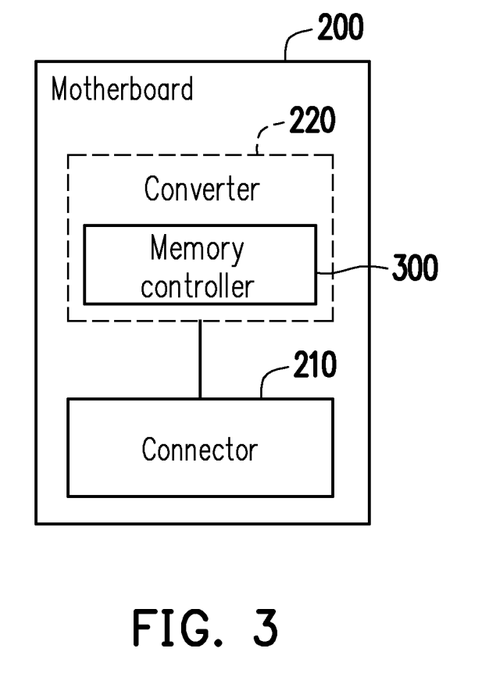
FIG. 3 is a schematic circuit block diagram of a motherboard according to another embodiment of the disclosure.

FIG. 2 is a schematic circuit block diagram of a motherboard 200 according to an embodiment of the disclosure, and FIG. 3 is a schematic circuit block diagram of the motherboard 200 according to another embodiment of the disclosure. With reference to FIG. 2 and FIG. 3, the motherboard 200 includes a memory controller 300 and a connector 210, and the memory controller 300 is coupled to the connector 210. In addition, the connector 210 may be coupled to the connection portion 110 of the memory module 100 shown in FIG. 1. Depending on design requirements, the connector 210 may include a dual in-line memory module (DIMM) slot or any other type of connector, and the connection portion 110 may include a set of gold fingers or any other type of electrical connection mechanism. With reference to FIG. 2, in an embodiment, the memory controller 300 is provided being directly embedded on the motherboard 200. With reference to FIG. 3, in another embodiment, the memory controller 300 may be provided on the converter 220, and the converter 220 may be provided on the motherboard 200. Depending on design requirements, the converter 220 may include a peripheral component interconnect express (PCI-E) riser card, but this embodiment is not limited thereto. That is to say, the memory controller 300 may be provided on the motherboard 200 in the form of a PCI-E card.

With reference to FIG. 1 and FIG. 2 (or FIG. 3), when the memory module 100 is inserted in the connector 210 of the motherboard 200, the connection portion 110 of the memory module 100 is coupled to the connector 210 of the motherboard 200. At this time, the memory controller 300 of the motherboard 200 accesses the first non-volatile memory chip 101 by a native interface of the first non-volatile memory chip 101 through the connector 210. Depending on design requirements, in some embodiments, the native interface may include an open NAND flash interface (ONFI) or a TOGGLE interface. Besides, the memory controller 300 of the motherboard 200 may also access the pointer stored in the second non-volatile memory chip 102 of the memory module 100 through the connector 210.

Based on the foregoing, the memory module 100 described in this embodiment is not provided with a memory controller and a built-in power supply circuit. Therefore, the memory module 100 provides additional space to accommodate more memory chips, thereby increasing the memory capacity of the memory module 100 and solving the problem of heat dissipation.

Figure 4:
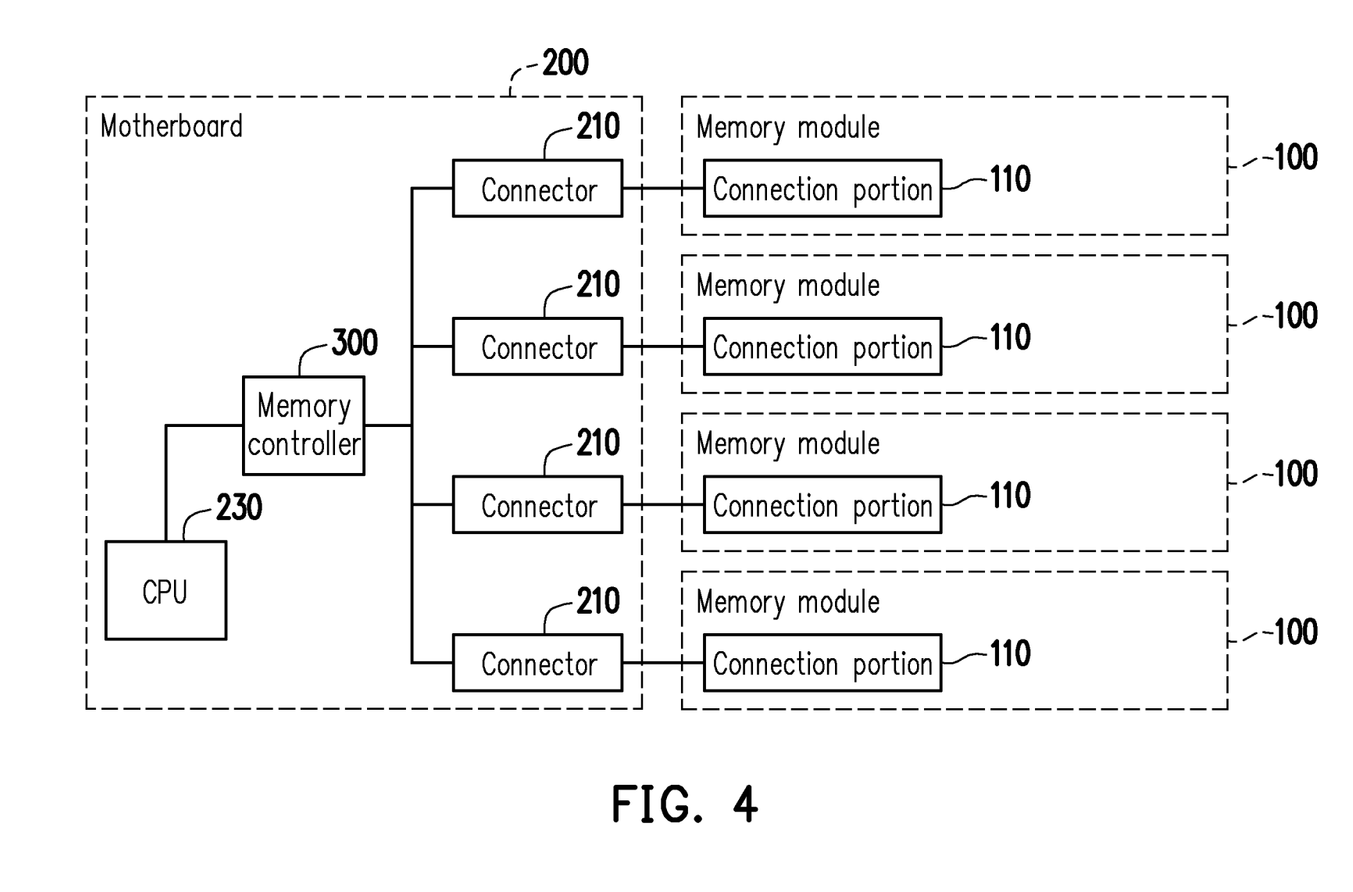
FIG. 4 is a schematic circuit block diagram of a motherboard and a memory module according to an embodiment of the disclosure.

FIG. 4 is a schematic circuit block diagram of the motherboard 200 and the memory module 100 according to an embodiment of the disclosure. In the embodiment shown in FIG. 4, the motherboard 200 has a central processing unit (CPU) 230, a memory controller 300, and four connectors 210. In any case, the number of the connectors 210 is not limited thereto. The four connectors 210 are adapted to be respectively coupled to respective connection portions 110 of four memory modules 100. In this embodiment, the four memory modules 100 shown in FIG. 4 may be different memory modules 100, such as memory modules 100 with different capacities, different operating frequencies, or different models. Since for the motherboard 200, the memory controller 300, and the connector 210 shown in FIG. 4, reference may be made to the related description of FIG. 2 or FIG. 3, and for the memory module 100 and the connection portion 110 shown in FIG. 4 reference may be made to the related description of FIG. 1, the same will not be repeatedly described.

In the embodiment shown in FIG. 4, the central processing unit 230 of the motherboard 200 may transmit a command to the memory controller 300 for accessing the four memory modules 100. Notably, the conventional central processing unit requires to access each memory module via the respective controller of the memory module. On the contrary, in this embodiment, the central processing unit 230 accesses the memory modules 100 via one single memory controller 300, which reduces the workload of the central processing unit 230. Therefore, the central processing unit 230 in general operates at a lower frequency, thereby reducing power consumption and reducing heat generated due to high-frequency operation. Moreover, in this embodiment, the memory controller 300 accesses the first non-volatile memory chip 101 on the memory module 100 (referring to the related description of FIG. 1 for details) via the native interface of the first non-volatile memory chip 101. Therefore, the memory module 100 does not require to convert the native interface into the DDR interface.

Figure 5:
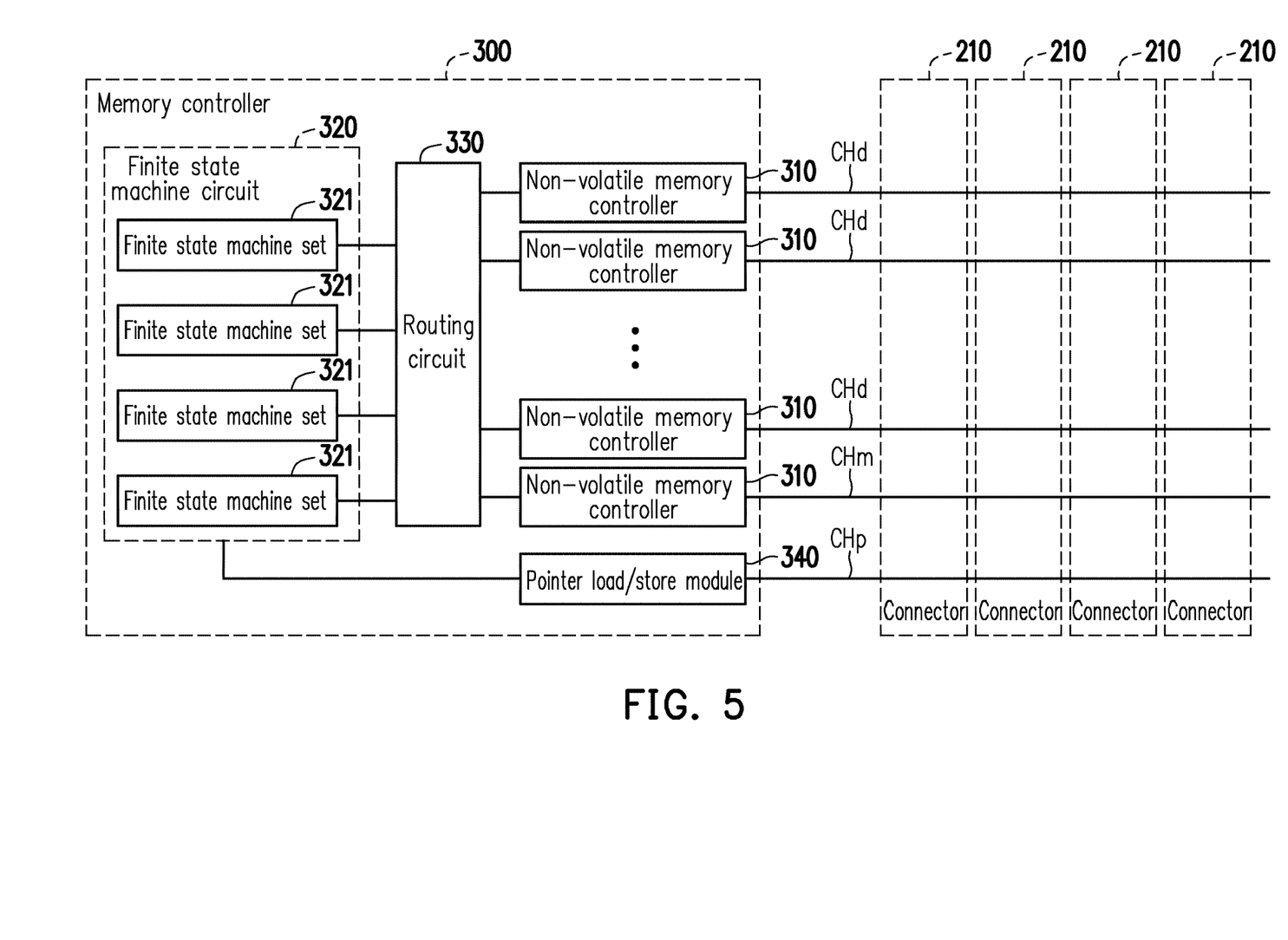
FIG. 5 is a schematic circuit block diagram of a memory controller according to an embodiment of the disclosure.

FIG. 5 is a schematic circuit block diagram of the memory controller 300 according to an embodiment of the disclosure. Depending on design requirements, in some embodiments, reference may be made to the related description of FIG. 5 for the memory controller 300 shown in FIG. 2, FIG. 3, or FIG. 4. In the embodiment shown in FIG. 5, the memory controller 300 includes a finite state machine circuit 320, a routing circuit 330, a plurality of non-volatile memory controllers 310, and one pointer load/store module 340. One end of the routing circuit 330 is coupled to the finite state machine circuit 320, and the other end of the routing circuit 330 is coupled to the plurality of non-volatile memory controllers 310.

For the connectors 210 shown in FIG. 5, reference may be made to the related description of FIG. 2, FIG. 3, or FIG. 4. Each of the connectors 210 shown in FIG. 5 includes a plurality of data channels CHd and one meta channel CHm. Each of the non-volatile memory controllers 310 is adapted to be coupled to the corresponding channel (the data channel CHd or the meta channel CHm) of each of the plurality of connectors 210 of the motherboard 200, to access the first non-volatile memory chip 101 of the memory module 100 through one of the connectors 210. That is, each of the non-volatile memory controllers 310 may manage the first non-volatile memory chip 101 of the memory module 100 coupled to any one of the connectors 210 through one corresponding data channel among the plurality of data channels CHd. Regarding the non-volatile memory controller 310, FIG. 7 will provide a more detailed description.

Depending on design requirements, in some embodiments, the non-volatile memory controller 310 may be a NAND flash controller (NFC) or any other controller. The NAND flash controller may be a conventional flash controller, and therefore will not be repeatedly described herein. In addition, the pointer load/store module 340 may access the second non-volatile memory chip 102 of the memory module 100 coupled to any one of the connectors 210 through a pointer channel CHp. In addition, the pointer load/store module 340 is coupled to the finite state machine circuit 320 to provide the pointer to a finite state machine set 321 of the finite state machine circuit 320.

The finite state machine circuit 320 includes a plurality of finite state machine sets 321. The finite state machines 321 may implement a flash translation layer (FTL) function via hardware. For example, the flash translation layer function includes operation such as address mapping, bad block management, garbage collection, wear leveling, and the like. Specifically, a finite state machine set may include a plurality of finite state machines. Each finite state machine is in charge of a different function. Also, the address of the data related to FTL may exist in form of pointers. That is, these pointers may be transmitted to NAND flash controller 310 through finite state machine set 321 to implement the FTL function. For more detailed implementation, refer may be made to Chinese Patent Publication No. CN 107678686B. The entirety of the above-mentioned Chinese patent is incorporated by reference herein and made a part of this specification. Each of the finite state machine sets 321 corresponds to one of the connectors 210. As a non-limiting example, when the memory module 100 is inserted in a first connector 210, a first finite state machine sets 321 may perform flash translation layer operation on the memory module 100 inserted in the first connector 210. By analogy, a fourth finite state machine sets 321 may perform flash translation layer operation on the memory module 100 inserted in a fourth connector 210. In any case, the number of the finite state machine sets 321 is not limited thereto. In addition, please refer to FIG. 4 and FIG. 5. Since the FTL function may be implemented by the finite state machine sets 321, the workload of the central processing unit 230 is reduced. Therefore, the central processing unit 230 in general operates at a lower frequency, thereby reducing power consumption and reducing heat generated due to high-frequency operation.

Figure 6:
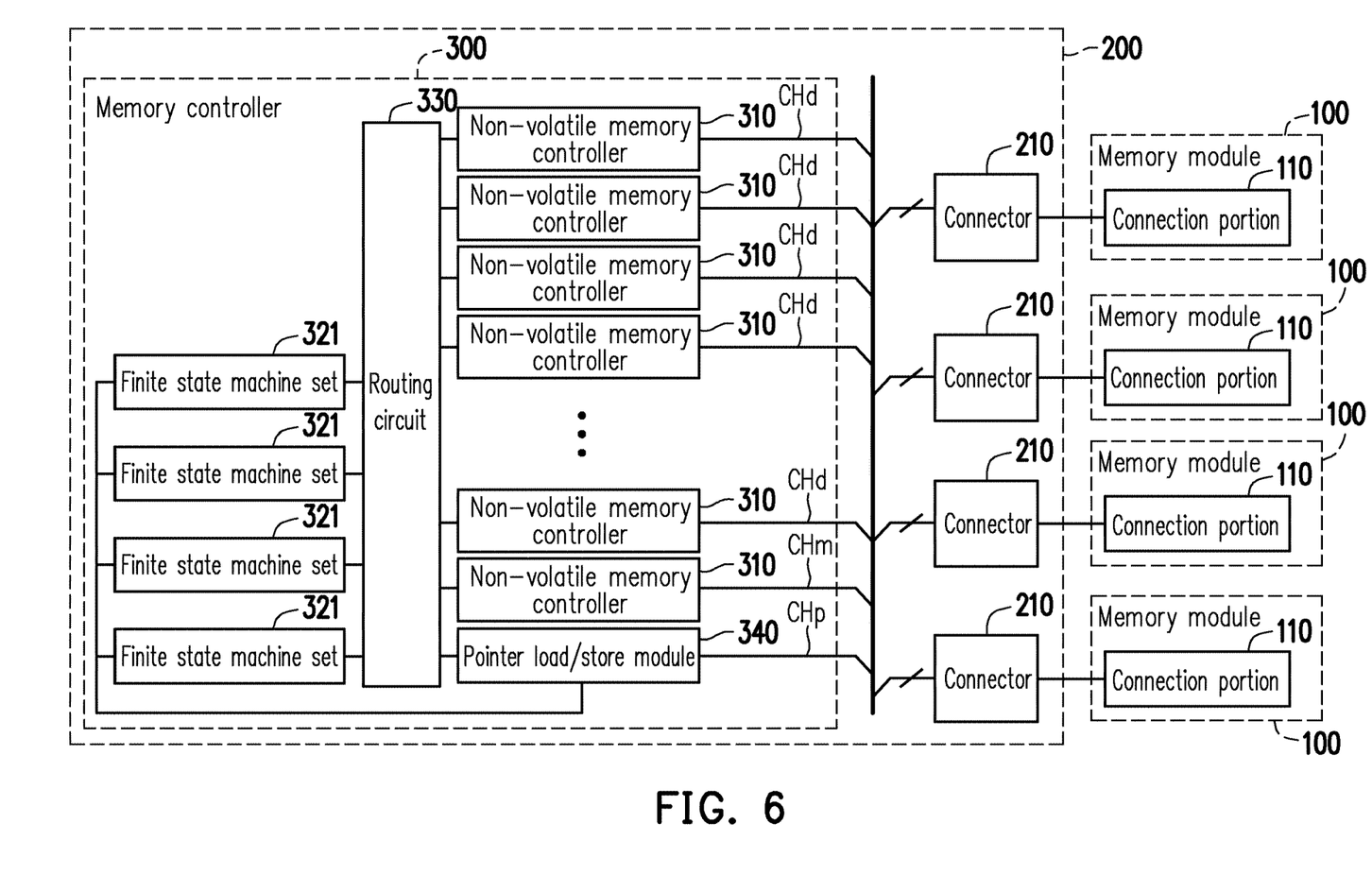
FIG. 6 is a schematic circuit block diagram of a memory controller and a plurality of memory modules according to an embodiment of the disclosure.

FIG. 6 is a schematic circuit block diagram of the memory controller 300 and a plurality of memory modules 100 according to an embodiment of the disclosure. Depending on design requirements, in some embodiments, reference may be made to the related description of FIG. 6 for the motherboard 200, the connector 210, and the memory controller 300 shown in FIG. 2, FIG. 3, or FIG. 4. In the embodiment shown in FIG. 6, the motherboard 200 includes four connectors 210, four finite state machine sets 321, and n+1 number of non-volatile memory controllers 310. For the memory controller 300, the finite state machine sets 321, the routing circuit 330, the non-volatile memory controllers 310, the pointer load/store module 340, and the connectors 210 shown in FIG. 6, reference may be made to the related description of FIG. 5. For the memory module 100 and the connection portion 110 shown in FIG. 6, reference may be made to the related description of FIG. 1.

In this embodiment, it is assumed that the connector 210 (the memory module 100) have n+1 number of channels (referring to the related description of the data channel CHd and the meta channel CHm shown in FIG. 5 for details), and the memory controller 300 is thus provided with n+1 number of non-volatile memory controllers 310. The n+1 number of channels include n number of data channels CHd and one meta channel CHm, where n is an integer determined depending on design requirements. In this embodiment, the memory controller 300 accesses the first non-volatile memory chip 101 of the memory module 100 (referring to the related description of FIG. 1 for details) through the n+1 number of channels and the four connectors 210.

The pointer load/store module 340 is coupled to the finite state machine set 321 of the finite state machine circuit 320. The pointer load/store module 340 is adapted to be coupled to the pointer channel CHp of each of the connectors 210 of the motherboard 200. In this embodiment, the pointer load/store module 340 in the memory controller 300 accesses the pointer stored in the second non-volatile memory chip 102 of the memory module 100 (refer to the related description of FIG. 1 for details) through the connector 210 and the pointer channel CHp. The pointer load/store module 340 may provide the pointer to the finite state machine set 321 of the finite state machine circuit 320.

In addition, depending on operation requirements, the pointer load/store module 340 may store flash translation layer information of the four finite state machine set 321 (e.g., the address mapping information, the bad block management information, garbage collection information, wear leveling information, etc.) in the second non-volatile memory chip 102 of the memory module 100 (referring to the related description of FIG. 1 for details) through the pointer channel CHp and the connector 210. In addition, the second non-volatile memory chip 102 may also store the namespace information and ONFI information of the memory module 100 to which it belongs. The namespace information includes partition information of the memory module 100. The ONFI information includes information such as the capacity, the operating frequency, and the model of the memory module 100.

Notably, the flash translation layer information of the convention memory is stored in the block 0 of the flash memory chip. When the block 0 is damaged, data in the entire flash memory chip cannot be read. On the contrary, in this embodiment, by storing the flash translation layer information of all the first non-volatile memory chips 101 of the memory module 100 in the second non-volatile memory chip 102, the memory module 100 can still be read normally even if the block 0 of a certain first non-volatile memory chip 101 is damaged. Besides, the memory controller 300 may operate the four memory modules 100 with different capacities, different operating frequencies, or different models at the same time via the ONFI information.

Figure 7:
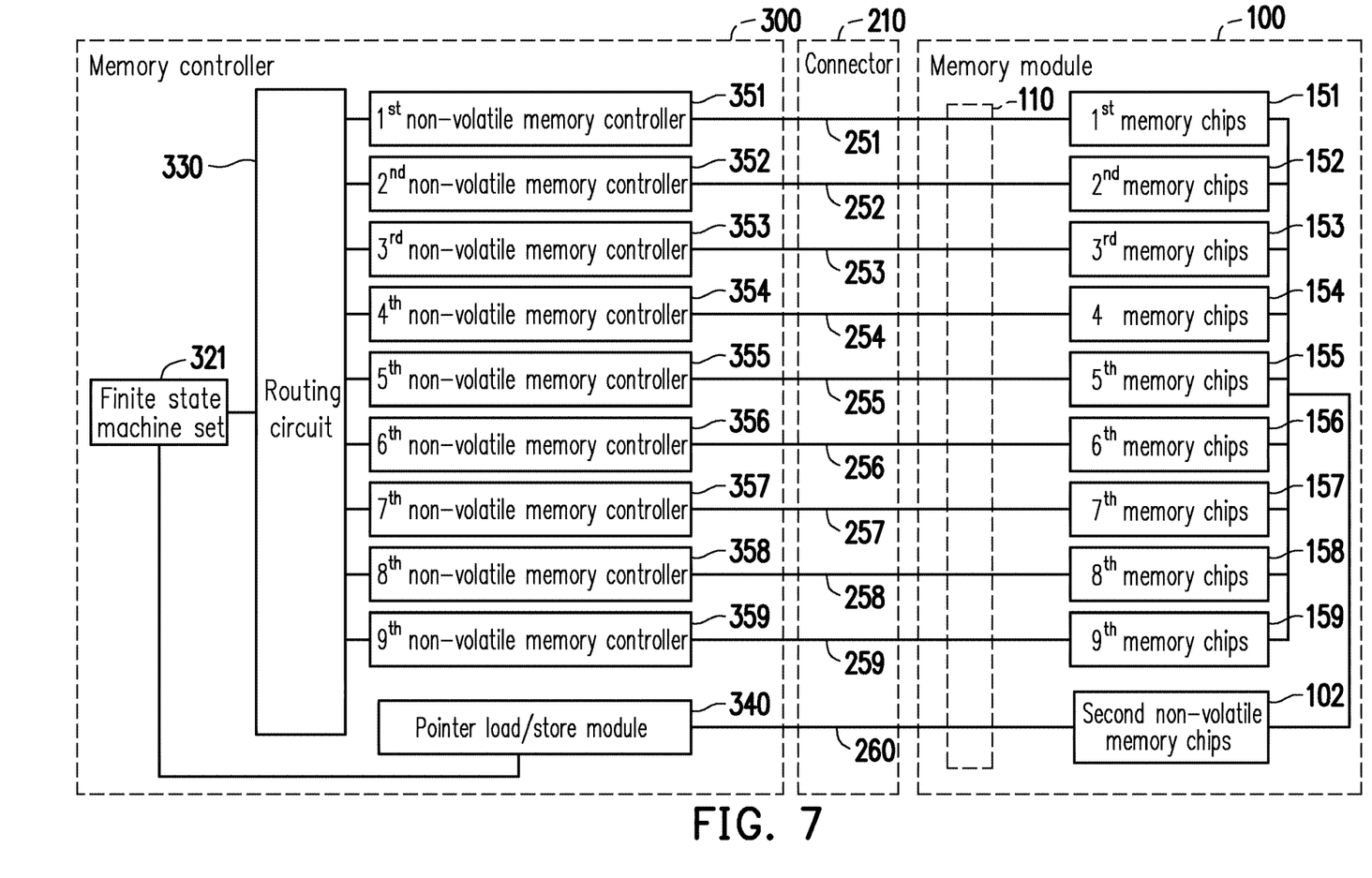
FIG. 7 is a schematic circuit block diagram of a memory controller and a memory module according to an embodiment of the disclosure.

FIG. 7 is a schematic circuit block diagram of the memory controller 300 and the memory module 100 according to an embodiment of the disclosure. In this embodiment, the memory controller 300 includes a finite state machine set 321, nine non-volatile memory controllers, and one pointer load/store module 340. In addition, the connector 210 includes nine corresponding general channels (eight data channels 251 to 258 and one meta channel 259) and one pointer channel 260. In this embodiment, the nine non-volatile memory controllers are respectively $1^{st}$ to $9^{th}$ non-volatile memory controller 351 to 359. Moreover, the $1^{st}$ to $8^{th}$ non-volatile memory controllers 351 to 358 correspond to the data channels 251 to 258, and the $9^{th}$ non-volatile memory controller 359 corresponds to the meta channel 259.

In this embodiment, the memory module 100 includes nine memory chips. The nine memory chips are respectively $1^{st}$ to $9^{th}$ memory chips 151-159. Reference may be made to the related description of the first non-volatile memory chip 101 shown in FIG. 1 for the $1^{st}$ to $9^{th}$ memory chips 151 to 159 by analogy. In addition, the $1^{st}$ to $9^{th}$ non-volatile memory controllers 351 to 359 respectively correspond to the $1^{st}$ to $9^{th}$ memory chips 151 to 159. Furthermore, one end of the $1^{st}$ to $9^{th}$ non-volatile memory controllers 351 to 359 is coupled to the finite state machine set 321 through the routing circuit 330, and the other end of the $1^{st}$ to $9^{th}$ non-volatile memory controllers 351 to 359 is respectively coupled to the $1^{st}$ to $9^{th}$ memory chips 151 to 159 of the memory module 100 through the general channels 251 to 259. One end of the non-volatile memory controllers 351-359 is coupled to the $1^{st}$ to $9^{th}$ memory chips 151-159 through the connection portion 110 and the connector 210. The finite state machine set 321 may issue a command (e.g., an access command, a management command, or any other command) to the $1^{st}$ to $9^{th}$ non-volatile memory controllers 351 to 359 through the routing circuit 330. Based on the command of the finite state machine set 321, the non-volatile memory controllers 351-359 may perform corresponding operation on the memory chips 151-159 (e.g., access operation, management operation, or any other operation).

In addition, the finite state machine set 321 is coupled to the connection portion 110 of the memory module 100 through the pointer load/store module 340 and then through the pointer channel 260 to access the second non-volatile memory chip 102 of the memory module 100. The second non-volatile memory chip 102 may store at least one pointer of a meta data related to the first non-volatile memory chip 101. In an embodiment, the second non-volatile memory chip 102 may be EEPROM comprising an I²C interface, but the disclosure is not limited thereto.

In summary of the foregoing, in the embodiments of the disclosure, controllers of the plurality of memory modules are integrated into one controller on the motherboard, and an active power supply is not included. Besides, in some embodiments, the memory module adopts the native interface of the memory chip as the pin, which does not require to be further converted into the DDR interface. Moreover, in some embodiments, the memory controller uses the state machine to implement the FTL function through hardware, and then stores the FTL information in the I²C EEPROM of the memory module. Therefore, the memory module provides additional space to accommodate more memory chips, which increases the capacity of the memory module, reduces the burden on the CPU, and solves the problem of heat dissipation. Furthermore, in some embodiments, the host may operate different memory modules at the same time, and even if the block 0 of the memory chip in the memory module is damaged, the memory module can still be accessed normally.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory module without a controller and without a built-in power supply, adapted to be inserted in a connector of a motherboard, the memory module comprising:
   a connection portion configured to be coupled to the connector of the motherboard;
   at least one first non-volatile memory chip coupled to the connection portion, wherein a memory controller of the motherboard accesses the first non-volatile memory chip by a native interface of the first non-volatile memory chip through the connector,
wherein the native interface comprises an open NAND flash interface (ONFI) or a TOGGLE interface, and
the connection portion and the connector are coupled between the memory controller and the first non-volatile memory chip; and
a second non-volatile memory chip coupled to the connection portion, and configured to store at least one pointer of a meta data related to the first non-volatile memory chip, wherein a memory type of the second non-volatile memory chip is different from a memory type of the first non-volatile memory chip, and the memory controller accesses the pointer stored in the second non-volatile memory chip through the connector.

2. The memory module according to claim 1, wherein the connector comprises a dual in-line memory module slot, and the connection portion comprises a set of gold fingers.

3. The memory module according to claim 1, wherein the meta data comprises at least one of address mapping information, bad block information, timing information, and namespace information of the first non-volatile memory chip.

4. The memory module according to claim 1, wherein the at least one first non-volatile memory chip comprises flash memory, and the second non-volatile memory chip comprises electrically-erasable programmable read-only memory.

5. A memory controller, adapted to be disposed on a motherboard, the memory controller comprising:
a finite state machine circuit comprising a plurality of finite state machine sets;
a routing circuit coupled to the finite state machine circuit; and
a plurality of non-volatile memory controllers coupled to the routing circuit, wherein each of the plurality of non-volatile memory controllers is adapted to be coupled to a corresponding channel of each of a plurality of connectors of the motherboard to access a first non-volatile memory chip of a memory module without a controller by a native interface of the first non-volatile memory through one of the plurality of connectors, and each of the plurality of finite state machine sets corresponds to one of the plurality of connectors,
wherein the native interface comprises an open NAND flash interface (ONFI) or a TOGGLE interface, and
a connection portion of the memory module and the plurality of connectors are coupled between the memory controller and the first non-volatile memory chip.

6. The memory controller according to claim 5, wherein the memory controller is disposed on a converter, the converter is disposed on the motherboard, and the converter comprises a peripheral component interconnect express (PCI-E) riser card.

7. The memory controller according to claim 5, wherein each of the connectors comprises the corresponding channel, the corresponding channel is one of a plurality of data channels and a meta channel, and one of the non-volatile memory controllers accesses the first non-volatile memory chip through the corresponding channel.

8. The memory controller according to claim 5, further comprising:
a pointer load/store module coupled to the finite state machine circuit, wherein the pointer load/store module is adapted to be coupled to a pointer channel of each of the connectors of the motherboard to access a second non-volatile memory chip of the memory module through one of the connectors, and a memory type of the second non-volatile memory chip is different from the memory type of the first non-volatile memory chip.

9. The memory controller according to claim 8, wherein the first non-volatile memory chip comprises flash memory, and the second non-volatile memory chip comprises electrically-erasable programmable read-only memory.

10. The memory controller according to claim 8, wherein the pointer load/store module accesses at least one pointer of a meta data related to the first non-volatile memory stored in the second non-volatile memory chip through the pointer channel, the meta data comprises at least one of address mapping information, bad block information, timing information, and namespace information of the first non-volatile memory chip, and the pointer load/store module provides the pointer to the finite state machine circuit.

11. A host, comprising:
a motherboard comprising a memory controller and a plurality of connectors; and
at least one memory module comprising a connection portion, at least one first non-volatile memory chip, and a second non-volatile memory chip, wherein the connection portion is adapted to be coupled to any one of the plurality of connectors of the motherboard, a memory type of the second non-volatile memory chip is different from a memory type of the first non-volatile memory chip, the memory controller accesses the first non-volatile memory chip by a native interface of the first non-volatile memory chip through one of the plurality of connectors, the second non-volatile memory chip is configured to store at least one pointer of a meta data related to the first non-volatile memory chip, and the memory controller accesses the pointer stored in the second non-volatile memory chip through one of the plurality of connectors,
wherein the native interface comprises an open NAND flash interface (ONFI) or a TOGGLE interface, and
the connection portion and the plurality of connectors are coupled between the memory controller and the first non-volatile memory chip.

12. The host according to claim 11, wherein the memory controller comprises:
a finite state machine circuit comprising a plurality of finite state machine sets;
a routing circuit coupled to the finite state machine circuit; and
a plurality of non-volatile memory controllers coupled to the routing circuit, wherein each of the plurality of non-volatile memory controllers is adapted to be coupled to a corresponding channel of each of the plurality of connectors of the motherboard to access the first non-volatile memory chip of the at least one memory module through one of the plurality of connectors, and each of the plurality of finite state machine sets corresponds to one of the plurality of connectors.

13. The host according to claim 12, wherein each of the plurality of connectors comprises the corresponding channel, the corresponding channel is one of a plurality of data channels and a meta channel, and one of the plurality of non-volatile memory controllers accesses the first non-volatile memory chip through the corresponding channel.

14. The host according to claim 12, wherein the memory controller further comprises:
a pointer load/store module coupled to the finite state machine circuit, wherein the pointer load/store module is adapted to be coupled to a pointer channel of each of the plurality of connectors of the motherboard to access the second non-volatile memory chip of the memory module through one of the plurality of connectors.

15. The host according to claim 14, wherein the pointer load/store module accesses the pointer stored in the second non-volatile memory chip through the pointer channel, and the pointer load/store module provides the pointer to the finite state machine circuit.

16. The host according to claim 11, wherein the plurality of connectors comprise a dual in-line memory module slot, and the connection portion comprises a set of gold fingers.

17. The host according to claim 11, wherein the native interface comprises an open NAND flash interface (ONFI) or a TOGGLE interface.

18. The host according to claim 11, wherein the meta data comprises at least one of address mapping information, bad block information, timing information, and namespace information of the first non-volatile memory chip.

19. The host according to claim 11, wherein the at least one first non-volatile memory chip comprises flash memory, and the second non-volatile memory chip comprises electrically-erasable programmable read-only memory.

20. The host according to claim 11, wherein the memory controller is provided on a converter, the converter is provided on the motherboard, and the converter comprises a peripheral component interconnect express (PCI-E) riser card.

* * * * *